United States Patent
Leman

(10) Patent No.: US 6,233,158 B1
(45) Date of Patent: May 15, 2001

(54) METHOD AND APPARATUS FOR INSTALLING AND GROUNDING A MOTHERBOARD IN A COMPUTER CHASSIS

(75) Inventor: Michael Leman, Eagle, ID (US)

(73) Assignee: Micron Electronics, Inc., Nampa, ID (US)

( * ) Notice: Subject to any disclaimer, the term of this patent is extended or adjusted under 35 U.S.C. 154(b) by 0 days.

(21) Appl. No.: 09/368,480

(22) Filed: Aug. 4, 1999

(51) Int. Cl.[7] .............................. G06F 1/16; H05K 7/14; H05K 9/00

(52) U.S. Cl. .................. 361/799; 361/683; 361/800; 361/816; 175/51; 175/35 R; 211/41.17

(58) Field of Search ..................................... 361/683, 686, 361/727, 799, 800–802, 759, 816, 35 R; 174/51; 211/41.17; 439/377; 312/223.2

(56) References Cited

U.S. PATENT DOCUMENTS

| | | | |
|---|---|---|---|
| 5,332,306 | * | 7/1994 | Babb et al. .......................... 361/727 |
| 5,691,504 | * | 11/1997 | Sands et al. ........................ 174/35 R |
| 6,088,222 | * | 7/2000 | Schmitt et al. ..................... 361/686 |

FOREIGN PATENT DOCUMENTS

| | | | |
|---|---|---|---|
| 3-105997 | * | 5/1991 | (JP) . |
| WO 87/05776 | * | 9/1987 | (WO) . |

* cited by examiner

Primary Examiner—Jayprakash N. Gandhi
(74) Attorney, Agent, or Firm—Perkins Coie LLP

(57) ABSTRACT

Methods and apparatuses for installing and grounding a motherboard in a chassis of a computer. In one embodiment of the invention, a computer chassis includes a movable cover plate having a grounding contact. The cover plate is releasably attachable to a panel of the chassis and covers an input/output aperture in a chassis panel. The cover plate is movable to a first position in which the cover plate closes the input/output aperture in the panel and the grounding contact on the cover plate engages a ground contact on a motherboard installed in the chassis. The cover plate is also moveable to a second position in which a fastening portion of the cover plate is disengaged from the panel and the grounding contact is disengaged from the ground contact on the motherboard. When the cover plate is in the disengaged position, the motherboard can pass into or out of the component cavity of the chassis without contacting the grounding contact of the cover plate. The movable cover plate may be detachable or removably attached to the chassis by hinges, snaps, latches or other suitable fasteners.

29 Claims, 6 Drawing Sheets

METHOD AND APPARATUS FOR INSTALLING AND GROUNDING A MOTHERBOARD IN A COMPUTER CHASSIS

TECHNICAL FIELD

The invention relates generally to assembling computers, and more particularly to methods and devices for installing and grounding a motherboard in a computer chassis.

BACKGROUND OF THE INVENTION

Computer chassis house processors, memory devices, power supplies, expansion cards and several other components. A computer chassis should protect the computer components from dust, static electricity, external electromagnetic interference (EMI) emissions, physical impact and other external factors. Computer chassis also protect users and the environment from EMI emissions generated by the computer components. In a typical application, a computer chassis has a high structural integrity to protect against physical impact, and conductive, shielding materials to reduce EMI emissions. The conductive components of the computer are also grounded to the chassis to protect users and computer components from electric shock.

In the competitive computer industry, it is important to efficiently install the components in the chassis to control the cost to assemble a computer or upgrade computer components. The efficiency of installing computer components in the chassis is a function of the ease of attaching, removing, or replacing components in the chassis. Additionally, motherboards and other components should be easily accessible for upgrading and expanding the hardware of computers. Thus, the design of the computer chassis for efficient assembly and upgrading directly impacts the overall cost of manufacturing a computer.

FIG. 1 is a schematic isometric overview of a computer system 10 including a computer 12, a monitor 14 coupled to the computer 12, and a keyboard 16 coupled to the computer 12. The operative components of the computer 12 are housed in a chassis 20. FIG. 2 is a schematic isometric top view illustrating the installation of an NLX motherboard 22 into the chassis 20. The NLX motherboard 22 is installed by sliding the motherboard 22 along guides 23 (arrow A). The motherboard 22 includes a metal gasket 24 with a row of beryllium copper spring fingers 26. As the motherboard 22 slides into the chassis 20, the spring fingers 26 slide across an interior chassis wall 28 to maintain a ground contact between the motherboard 22 and the chassis 20. After the motherboard 22 is installed in the chassis 20, the gasket 24 obstructs an opening 29 in the chassis wall 28 and shields the motherboard 22 from EMI emissions external environmental factors.

One drawback of the chassis 20 is that it may not adequately shield the computer components from EMI emissions. To adequately shield the computer components, an EMI shield must electrically contact the chassis at enclosure seam gaps. The prior art gasket 24 may not provide adequate EMI shielding because the spring fingers 26 may bend or break as they slide across the chassis wall 28 during installation or removal of the motherboard 22. As a result, the spring fingers 26 may not contact the chassis 20 in a manner that properly grounds the motherboard 22 and restricts EMI emissions.

Another drawback of the chassis 20 is that it may not have sufficient structural integrity to protect the computer components during shipping and operation. To permit installation of the motherboard 22, a backplate 30 is removed from the chassis 20 and the rear corner of the sidewall 28 includes a notch 27 to receive the motherboard 22. The removable backplate 30 detrimentally effects the structural integrity and strength of the chassis 20 because the entire rear surface of the chassis 20 is a separate component that may become loose. Additionally, the notch 27 reduces the strength of the sidewall 28 such that the sidewall 28 is subject to twisting at the rear corner of the chassis 20. The chassis 20, therefore, may not have sufficient structural integrity to adequately protect the computer components.

The chassis 20 also presents a manufacturing concern because it may impair efficient installation and/or removal of the motherboard 22. For example, because the fingers 26 may be damaged or destroyed as they slide across the interior wall 28, installers must use great care and slowly slide the motherboard 22 into the chassis 20. Installing and removing NLX motherboards 22 is accordingly a time consuming part of assembling or upgrading computers. Moreover, if the fingers 26 are damaged, more time is required to repair the fingers 26 or replace the gasket 24. Thus, the chassis 20 may significantly impair the manufacturing and repair costs of computers with NLX motherboards.

SUMMARY OF THE INVENTION

The present invention is directed toward a computer chassis and methods for installing components in the chassis. One computer chassis of the present invention includes a plurality of panels configured to define an interior cavity, an input/output aperture in one of the panels, and a movable cover plate having a grounding contact. The cover plate has a fastening portion that is releasably attachable to a panel of the chassis to cover the input/output aperture. The cover plate is movable to a first position in which the cover plate closes the input/output aperture and the grounding contact electronically couples with a ground contact of a motherboard in the chassis. The cover plate is also moveable to a second position in which the fastening portion of the cover plate is disengaged from the panel and the grounding contact is disengaged from the ground contact on the motherboard. When the cover plate is in the second position, the motherboard can pass into or out of the component cavity of the chassis without contacting the grounding contact of the cover plate.

The cover plate can be pivotally attached and/or removably attached to the chassis. For example, the cover plate can be hingeably attached to the chassis to rotate between the first and second positions, or the cover plate can be completely detachable from the chassis. To hold the cover plate in the first position, the chassis can further include a snap that "snap-fits" the cover plate into the input/output aperture of the chassis, a latch, or another suitable fastener. The cover plate may be positioned in any part of the chassis itself, as long as the grounding contact of the cover plate electronically couples with the ground contact of the motherboard when the cover plate is in the first position.

BRIEF DESCRIPTION OF THE DRAWINGS

In the drawings, like reference numbers refer to similar elements or processes.

DETAILED DESCRIPTION OF THE INVENTION

The present invention is directed toward methods and apparatuses for installing a motherboard in a computer chassis and for electrically protecting the motherboard and other components of the computer. Several embodiments of the invention are directed toward a computer chassis having an input/output aperture and a cover plate to obstruct the aperture. The cover plate, for example, can be moved with respect to the chassis to a disengaged position in which the motherboard can slide into the housing without contacting the cover plate. The cover plate can also be moved with respect to the housing to an engaged position in which the cover plate closes the aperture and is electrically coupled to the motherboard. Many specific details of certain embodiments of the invention are set forth in the following description and in FIGS. 3–6 to provide a thorough understanding of such embodiments. One skilled in the art, however, will understand that the present invention may have additional embodiments, or that the invention may be practiced without several of the details described in the following description.

Figure 3:
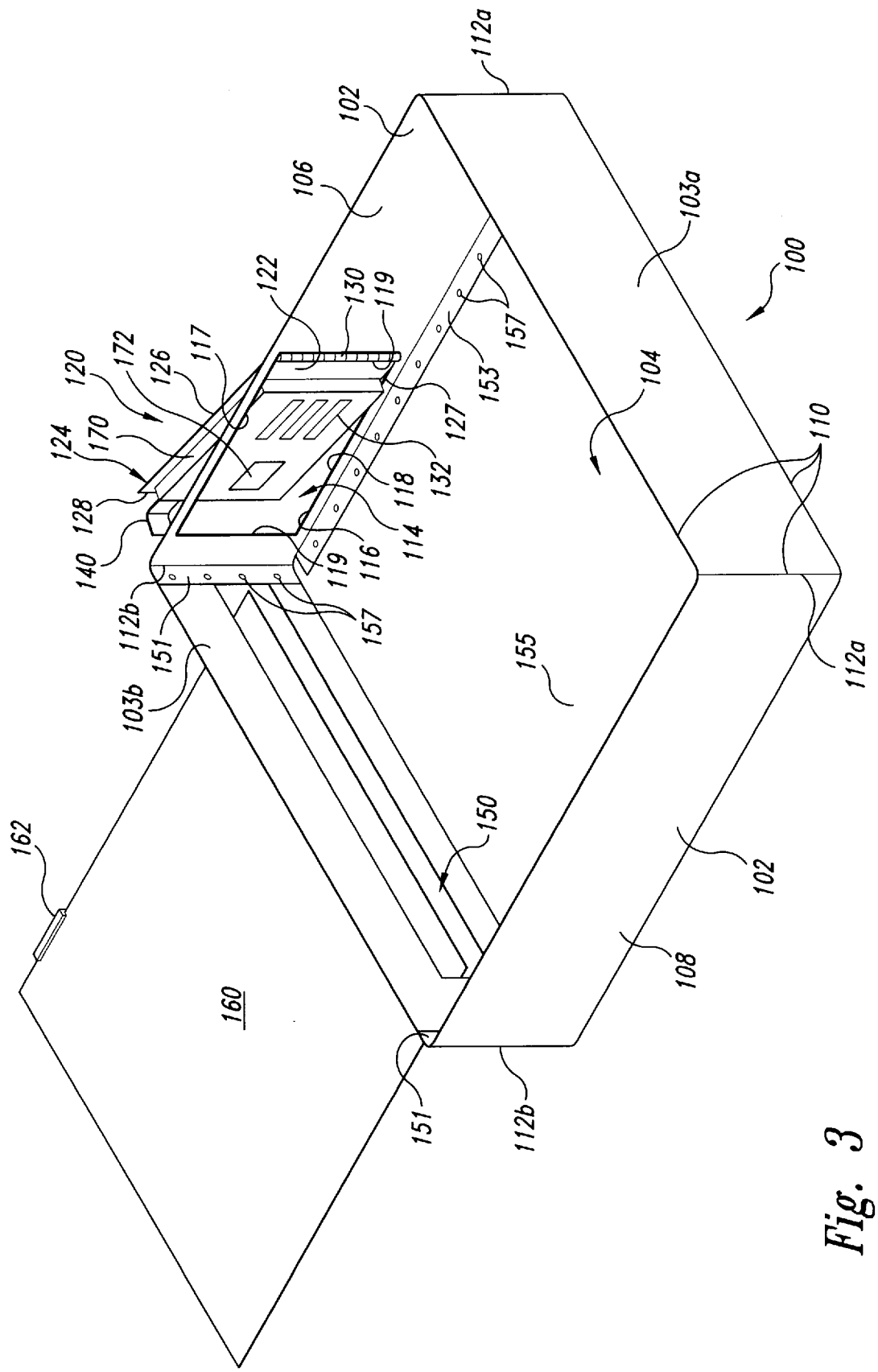
FIG. 3 is a schematic isometric top view of a computer chassis including a cover plate in accordance with an embodiment of the present invention.

FIG. 3 is a schematic isometric top view illustrating a computer chassis 100 in accordance with one embodiment of the invention. The chassis 100 generally has a plurality of side panels 102, a front panel 103a, and a rear panel 103b that are configured to define an interior cavity 104. The chassis 100 can house a processor, memory devices, expansion cords, and other electronic components (not shown) of the computer system. Each panel 102, 103a and 103b can have a first side 106 facing the cavity 104, a second side 108 facing away from the cavity 104, and a plurality of perimeter edges 110. The boundaries between the side panels 102 and the front panel 103a define front corners 112a, and the boundaries between the side panels 102 and the rear panel 103b define rear corners 112b (collectively referred to as "corners 112").

Figure 4:
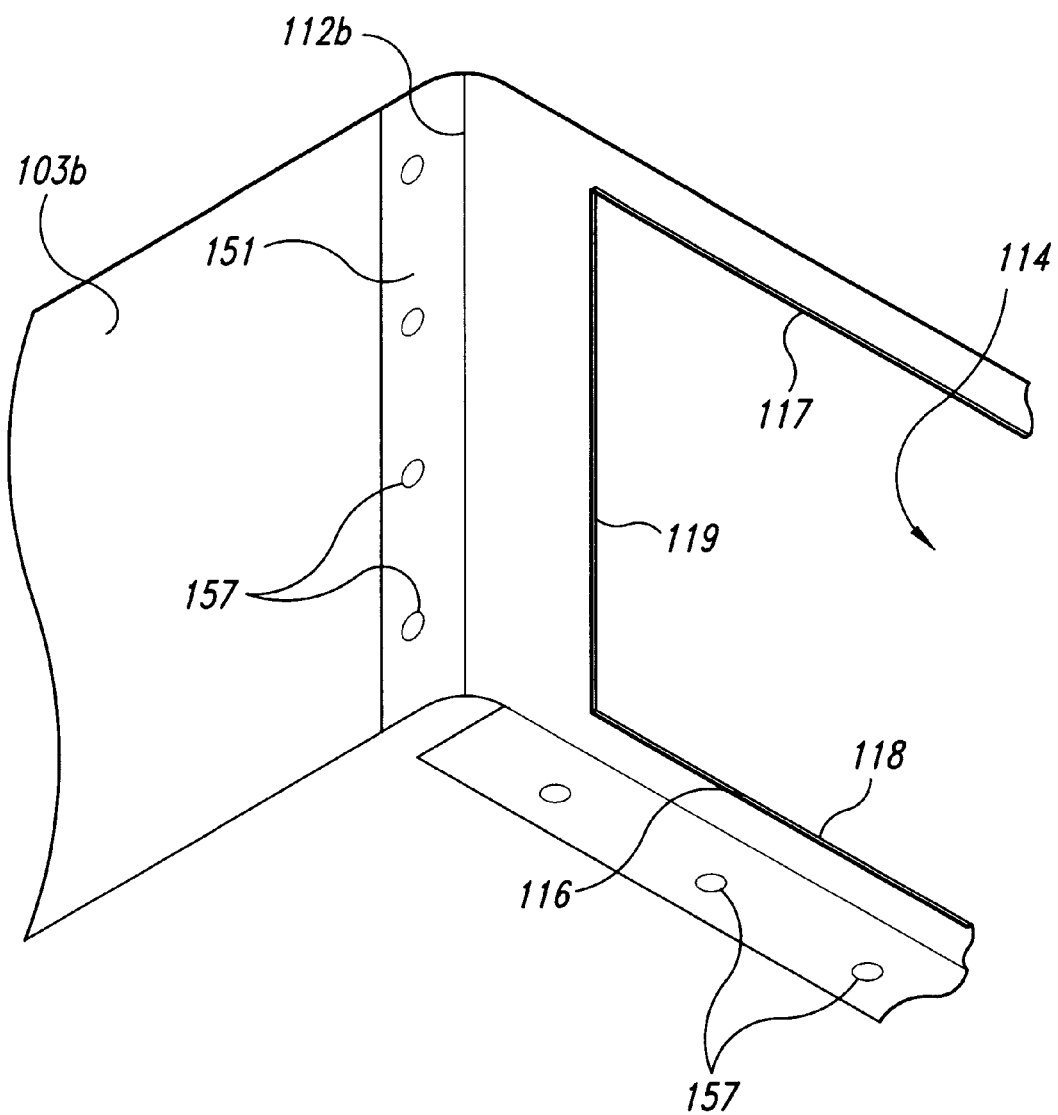
FIG. 4 is a schematic isometric exploded view of one corner of the computer chassis of FIG. 3.

As illustrated in FIG. 4, the corners 112 can be formed by bending a piece of metal along desired boundary lines and/or connecting adjacent perimeter edges 110 with a fastener (e.g., rivet, bolt, screw or other suitable devices). In the embodiment shown in FIGS. 3 and 4, the front panel 103a and the side panels 102 are formed by bending a single piece of sheet metal to create the front corners 112a, rear corner flanges 151, and bottom flanges 153. Alternatively, the front panel 103a and the side panels 102 can be formed by molding or extruding a single piece of sheet metal to create the front corners 112a, rear corner flanges 151, and bottom flanges 153. The rear panel 113b can be securely attached to the rear corner flanges 151 by at least one fastener 157, and a bottom panel 155 can be attached to the bottom flanges 153 by a plurality of fasteners 157. The front corners 112a and the rear corner flanges 151 are highly stable structures that resist torsional flexion of the side panels 102, the front panel 103a and the rear panel 103b. The panel configuration illustrated in FIGS. 3 and 4, therefore, provides a highly stable chassis.

Referring again to FIG. 3, the chassis 100 also includes an input/output aperture 114 through one of the panels 102 and a cover plate 120 releasably attached to the chassis 100 at the aperture 114. The aperture 114 can further include a mating flange 116 along top, bottom and side edges 117, 118, 119 of the aperture 114 to provide a close fit between the aperture 114 and the cover plate 120. The embodiment of the chassis 100 shown in FIG. 3 further includes a second aperture 150 in the rear panel 103b through which a motherboard 160 can pass to install or upgrade the motherboard 160.

The cover plate 120 of this embodiment has a first side 122, a second side 124, and top, bottom, and side edges 126, 127, 128. The first side 122 faces toward the interior cavity 104 of the computer chassis 100 when the cover plate 120 is in a closed and engaged position with respect to the chassis 100. Additionally, the cover plate 120 in the illustrated embodiment further includes input/output ports 132 and a section of conductive mesh covered foam 170 adhered to the first side 122 of the cover plate 120. The conductive mesh covered foam 170 can cover the entire first side 122 of the cover plate 120, or it can cover only a portion of the first side 122 of the cover plate 120. The foam 170 can be adhered to the cover plate 120 by clip-on strips, pressure sensitive adhesives, push-in fasteners, screws, rivets, epoxies or other suitable means. In an alternate embodiment, the cover plate 120 can be configured so that the foam 170 press-fits into grooves or form-fits into enclosure walls (not shown). As explained below, the mesh covered foam 170 has a grounding contact 172 to engage a ground contact 162 on the motherboard 160.

In additional embodiments, the cover plate 120 can be an electrically conductive plate, or an electromagnetic interference gasket that does not have the mesh covered foam. In any of these embodiments, the conductive mesh covered foam or the conductive cover plate 120 can fit closely to the chassis 100 to provide conductive pathways that electrically bond system components to a common ground. As such, the chassis 100 serves as a conductor to ensure that the chassis provides adequate electromagnetic shielding.

The cover plate 120 shown in FIG. 3 is moveably attached to the chassis panel 102 by a hinge 130. The hinge 130 can extend along the entire length of the first side edge 119 of the aperture 114, or the hinge 130 can extend along any portion of a top edge 117, a bottom edge 118, or the first side edge 119. The cover plate 120 can be rotated about the hinge 130 to an open, disengaged position in which the motherboard 160 can be installed in the chassis 100 without contacting the cover plate 120 or a side panel 102 of the chassis 100. The cover plate 120 can also be rotated to a closed, engaged position in which the grounding contact 172 on the cover plate 120 contacts the ground contact 162 of the motherboard 160. The cover plate 120 in the illustrated embodiment of FIG. 3 is shown in the open, disengaged position.

The chassis 100 can further include a latch 140 to secure the cover plate 120 to the side panel 102 and/or rear panel 103b. The latch 140 may be an overlock clasp as shown, or it may be an alternate securing device, such as a hook and eye. The latch 140 in the illustrated embodiment holds the cover plate 120 in the closed, engaged position to electrically couple the ground contact 162 on the motherboard 160 with the grounding contact 172 on the cover plate 120.

Figure 5:
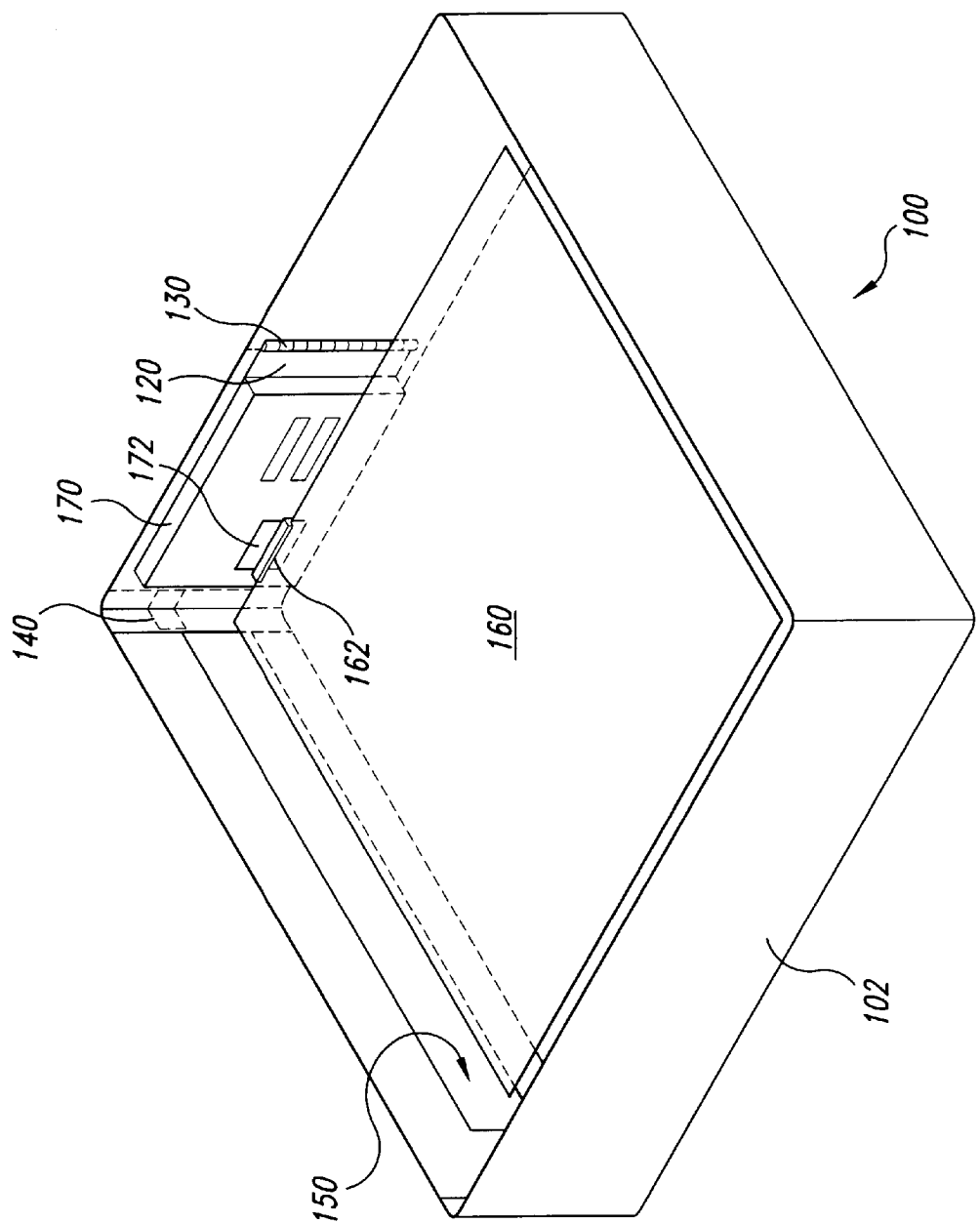
FIG. 5 is a schematic isometric top view of the computer chassis of FIG. 3 with a motherboard installed in the chassis and the hinged cover plate in a closed, engaged position.

FIGS. 3 and 5 together illustrate the operation of the chassis 100 for installing the motherboard 160 in the interior cavity 104 of the chassis 100. The cover plate 120 is initially placed in the open position (FIG. 3) to remove the conductive pad 170 from obstructing the motherboard 160 during installation. An operator then passes the motherboard 160 through the second aperture 150 in the back panel 103b and into the cavity 104. The ground contact 162 on the motherboard 160 does not slide across the chassis 100 or any part of the cover plate 120 during installation. The cover plate 120 is then placed in the closed position (FIG. 5), and the second aperture is covered by another plate (not shown). When the motherboard 160 is installed in the interior cavity 104 of the computer chassis 100 and the cover plate 120 is in the closed position, the ground contact 162 of the motherboard 160 electronically couples with the ground contact 172 of the conductive mesh covered foam 170. The motherboard 160 can be removed from the chassis 100 by reversing this procedure.

Figure 1:
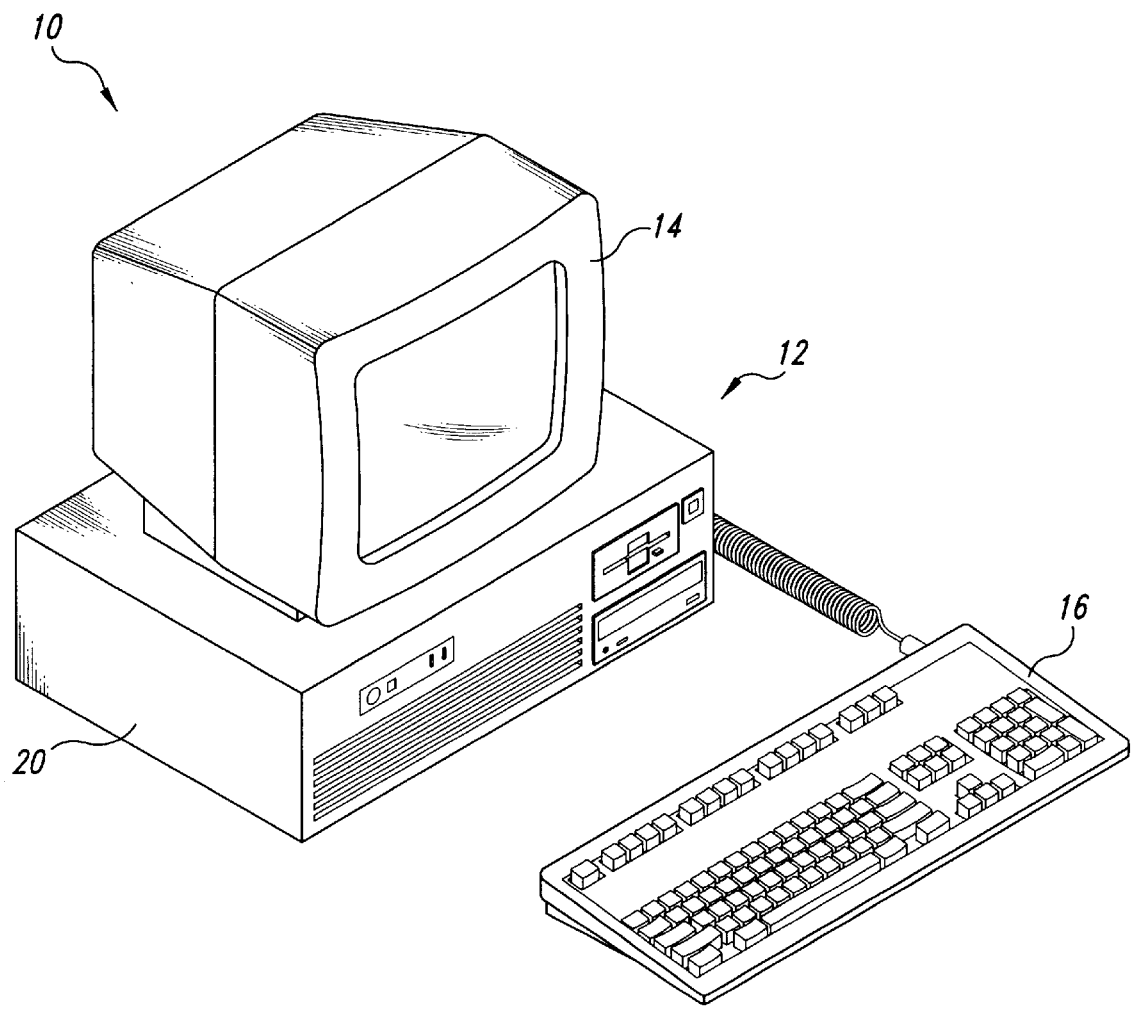
FIG. 1 is an overview of a computer system in accordance with the prior art.
Figure 2:
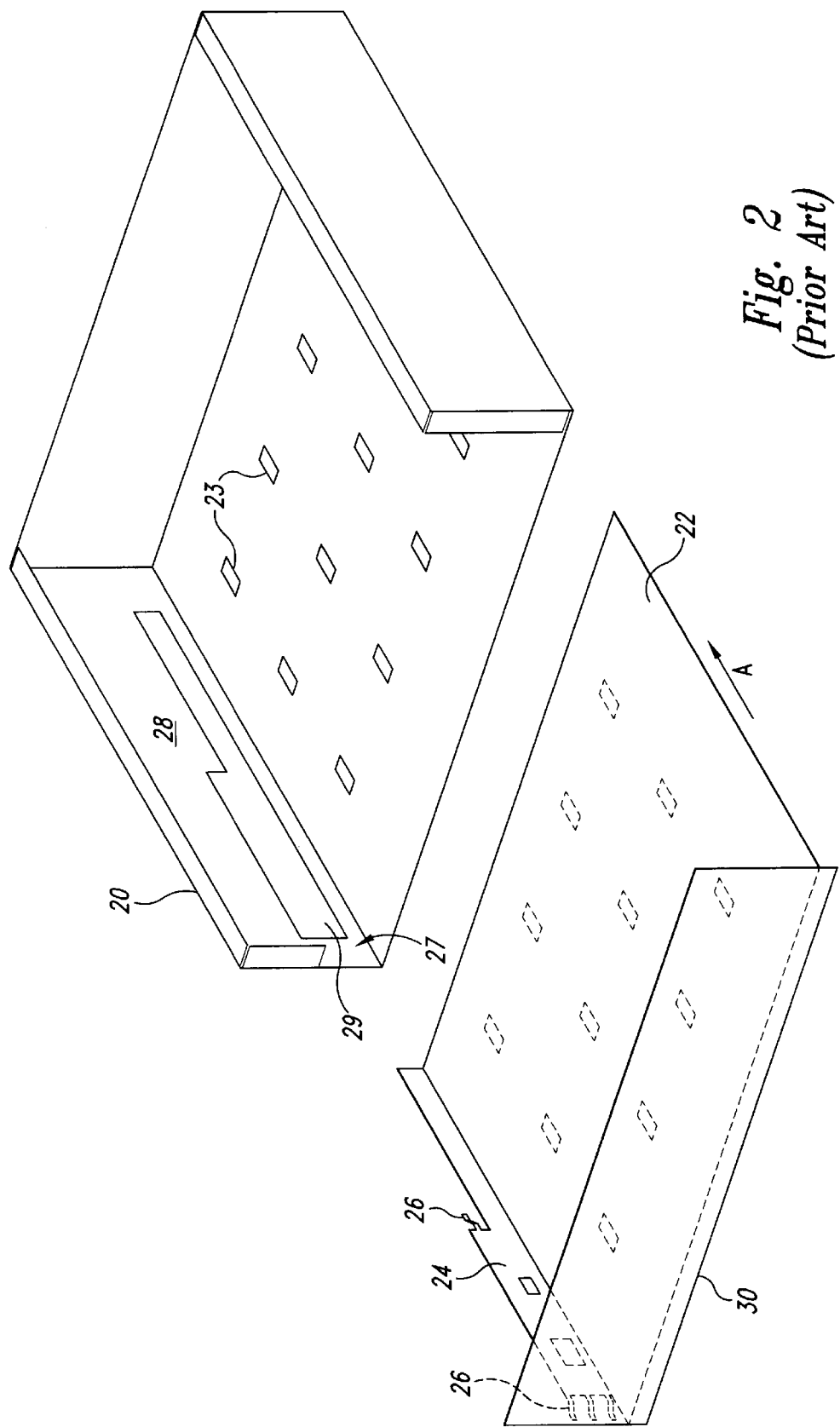
FIG. 2 is a schematic isometric top view of a computer chassis with a gasket having flexible spring fingers in accordance with the prior art.

The embodiment of the chassis 100 shown in FIGS. 3–5 is expected to provide easy installation of NLX motherboards and consistent EMI shielding. As explained above with reference to FIG. 2, conventional housings and NLX motherboards may not adequately shield or ground the computer components because the spring fingers on a conventional I/O gasket may bend or break. Additionally, as discussed previously, because the spring fingers are an internal component, it is not only difficult to detect whether the spring fingers are fully engaged, but it is also costly to replace the fingers. In the chassis 100, however, the cover plate 120 can be moved away from the chassis 100 so that ground contact 162 on the motherboard 160 does not contact the chassis 100 during installation and removal. The movable cover plate 120 accordingly prevents continuous wear and tear on the ground contact 162 of the motherboard 160 caused by sliding the motherboard with respect to the chassis. Further, the cover plate 120 is readily accessible for inspection, replacement or upgrading. It is not only visually possible to inspect the cover plate 120 and the grounding contact 172, but these components are readily accessible should the conductive material require replacement or upgrading. Thus, the cover plate 120 is expected to provide a cost efficient and reliable chassis for easy, fast installation and removal of the motherboard 160.

Figure 6:
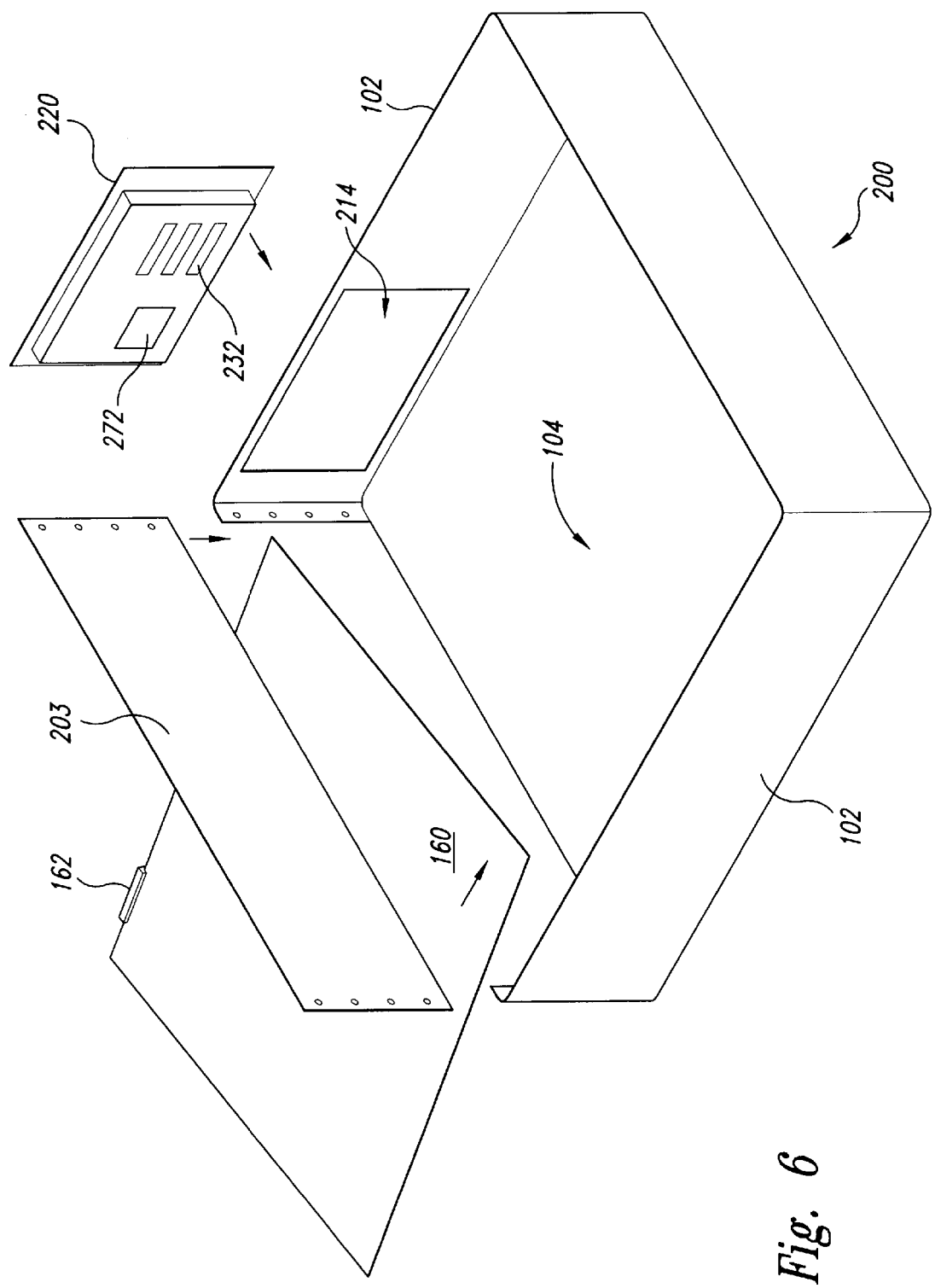
FIG. 6 is a schematic isometric top view of a computer chassis with a removable panel and a detachable cover plate in accordance with another embodiment of the present invention.

FIG. 6 illustrates a chassis 200 including a removable cover plate 220 in accordance with another embodiment of the invention. The cover plate 220 can be completely detached from the side panel 102. In this embodiment of the invention, the cover plate 220 can be removed from the chassis side panel 102 to allow unobstructed access of the motherboard 160 into the chassis 200. Once the motherboard 160 is positioned in the chassis 200, the cover plate 220 can be moved into the aperture 214 of the chassis 200 to electrically couple the ground contact 162 of the motherboard 160 with the grounding contact 272 of the cover plate 220. The cover plate 220 may also be secured to the chassis panel 102 with screws, snaps, clips or other fasteners to prevent it from disengaging from the motherboard 160.

The cover plate 220 provides for easy inspection and repair of the grounding contact 272 and input/output ports 232. Additionally, because the cover plate 220 can be completely removed during installation, wear and tear on both the grounding contact 272 of the cover plate 220 and the ground contact 162 of the motherboard 160 is virtually eliminated.

As further shown in FIG. 6, the chassis 200 can have a removable rear panel 203 for installing or removing the motherboard 160. The rear panel 203 can be attached to the side panel 102 by slots along a side edge into which the rear panel 203 slides, snaps, or latches, bolts, rivets or other suitable means. Removing the chassis panel 203 allows greater accessibility to the interior cavity 104 of the chassis 200 for more efficient installation and removal of the components in the interior cavity 104. In yet another alternative embodiment, the chassis shown in FIG. 6 with the removable rear panel 203 can be combined with any one of the above embodiments to provide increased accessibility to the interior cavity of the chassis.

From the foregoing, it will be appreciated that, although specific embodiments of the invention have been described herein for purposes of illustration, various modifications may be made without deviating from the spirit and scope of the invention. For example, many embodiments of the invention can include an input/output port to further increase the versatility of the cover plate. Accordingly, the invention is not limited except as by the appended claims.

What is clamed is:

1. A computer comprising:
   a chassis including a plurality of panels configured to define an interior cavity and an input/output aperture in one of the panels;
   a motherboard in the interior cavity of the chassis, the motherboard having a ground contact; and
   a moveable cover plate having a grounding contact and a fastening portion releasably attachable to the chassis to hold the cover plate to the chassis at the input/output aperture, the cover plate being moveable with respect to the chassis between a first position in which the fastening portion is separated from the chassis so that the grounding contact on the cover plate is disengaged from the ground contact on the motherboard to allow the motherboard to pass into or out of the cavity, and a second position in which the cover plate covers the input/output aperture and the grounding contact engages the ground contact on the motherboard when the motherboard is installed in the chassis.

2. The computer of claim 1 wherein the moveable cover plate includes:
   a hinge attached to a first side of the cover plate and to the chassis, the cover plate rotating about the hinge between the first position in which the cover plate projects away from the chassis so that the grounding contact on the cover plate is disengaged from the ground contact on the motherboard and the second position in which the cover plate at least substantially covers the input/output aperture; and
   a fastener attached to a second side of the cover plate, the fastener being configured to secure the moveable cover plate in the second position.

3. The computer of claim 1 wherein the moveable cover plate includes:
   a hinge attached to a first side of the cover plate and to the chassis, the cover plate rotating about the hinge between the first position in which the cover plate projects away from the chassis so that the grounding contact on the cover plate is disengaged from the ground contact on the motherboard and the second position in which the cover plate at least substantially covers the input/output aperture;
   a conductive mesh projecting away from at least a portion of the first side of cover plate to project into the housing when the cover plate is in the second position, at least a portion of the conductive covered mesh defining the grounding contact of the cover plate;
   at least one input/output port through the cover plate; and
   a latch attached to a second side of the cover plate, the latch being configured to secure the moveable cover plate in the second position.

4. The computer of claim 1 wherein the moveable cover plate is completely detachable from the panel of the chassis and the fastening portion of the cover plate comprises an edge portion of the cover plate sized to be adjacent to a portion of the panel proximate to the input/output aperture and a removable fastener to hold the edge portion of the cover plate to the chassis.

5. The computer of claim 4 further comprising:
   a conductive mesh projecting away from at least a portion of the first side of cover plate to project into the housing when the cover plate is in the engaged position, at least a portion of the conductive covered mesh defining the grounding contact of the cover plate;
   at least one input/output port through the cover plate; and
   a latch attached to a second side of the cover plate, the latch being configured to secure the moveable cover plate in the second position.

6. The computer of claim 1 wherein the chassis further includes:
   a flange formed along a side edge of the one of the panels having the input/output aperture, the flange formed from the chassis panel to define an angled contiguous corner; and
   a plurality of fasteners attaching the contiguous corner to the adjacent chassis panel to form a corner structure wherein the corner structure resists torsional forces on the chassis.

7. The computer of claim 1 wherein the moveable cover plate has a first side facing the interior cavity of the chassis and a second side facing away from the cavity and wherein the grounding contact comprises a conductive mesh covered foam adhered to a portion of the first side.

8. The computer of claim 1 wherein the moveable cover plate further includes an electromagnetic interference gasket.

9. The computer of claim 1 wherein the moveable cover plate further includes an input/output port.

10. The computer of claim 1 wherein the moveable cover plate is conductive.

11. The computer of claim 1 wherein the chassis includes first and second side panels, a rear panel at one end of the side panels, and a front panel at the other end of the side panels, each panel having a first side facing toward the interior cavity and a second side facing away from the interior cavity, and the panel including the input/output aperture being a side panel having a top edge, a bottom edge, a rear edge, and a flange at the rear edge extending from the top edge to the bottom edge to form a corner.

12. A computer comprising:
   a housing including a plurality of panels configured to define a component cavity and a first aperture in one of the panels;
   a motherboard in the component cavity of the housing, the motherboard having a ground contact; and
   an electronic contact plate having a first side, a second side opposite the first side, a grounding contact on the first side, and a fastener, the electronic contact plate being moveable with respect to the housing to close the first aperture in a closed position in which the first side faces toward the component cavity, the grounding contact engages the ground contact to electronically couple the electronic contact plate with the motherboard, and the fastener secures the contact plate to the housing, and the electronic contact plate being moveable with respect to the housing to an open position in which the grounding contact of the electronic contact plate disengages the ground contact of the motherboard.

13. The computer of claim 12 wherein the electronic contact plate includes:
   a hinge attached to the chassis, the contact plate rotating about the hinge between the open position in which the contact plate projects away from the chassis to separate at least a portion of the contact plate from the chassis and the closed position in which the contact plate at least substantially covers the first aperture; and
   the fastener comprises a latch attached to the second side of the contact plate, the latch being configured to secure the electronic contact plate in the closed position.

14. A computer chassis for receiving a motherboard, comprising:
   a housing having a plurality of sections forming an interior area to contain components of the computer and an input/output aperture in one of the sections; and
   a moveable cover plate having a fastening portion releasably attachable to the housing to cover the input/output aperture, the cover plate having a first surface, a second surface opposite the first surface, and a grounding contact on the first surface, the cover plate being positionable with respect to the housing between an engaged position in which the first surface faces the interior area of the housing and the grounding contact is positioned to be electrically coupled with a ground contact of the motherboard, and a disengaged position in which the grounding contact is positioned to be separated from the ground contact of the motherboard.

15. The computer chassis of claim 14 wherein the housing sections include first and second side panels, a rear panel at one end of the side panels, and a front panel at the other end of the side panels, each panel having a first side facing toward the interior area and a second side facing away from the interior area, and wherein one of the side panels includes the input/output aperture and has a top edge, a bottom edge, a rear edge, and a flange formed from the rear edge extending from the top edge to the bottom edge to define an angled contiguous corner.

16. The computer chassis of claim 14 wherein the moveable cover plate is detachable.

17. The computer chassis of claim 14 wherein the cover plate is an electromagnetic interference gasket.

18. The computer chassis of claim 14 wherein the cover plate further includes a hinge attached to the chassis, the cover plate rotating from the engaged position to the disengaged position.

19. The computer chassis of claim 14 wherein the cover plate further includes a latch on the second surface of the cover plate and the housing further includes a clasp on an exterior surface of the housing, the latch engaging the clasp to hold the cover plate in the engaged position.

20. A method of assembling a computer, comprising:
   disengaging a cover plate having a grounding contact from at least a portion of a panel in a chassis to separate at least the disengaged portion of the cover plate from an aperture in the chassis panel;
   installing a motherboard into the chassis; and
   engaging the cover plate with the panel to cover the aperture and contact the grounding contact of the cover plate with a ground contact of the motherboard.

21. The method of claim 20 wherein disengaging the cover plate includes rotating the cover plate about a hinge to a first position in which the grounding contact of the cover plate is moved away from the ground contact of the motherboard; and wherein engaging the cover plate includes rotating the cover plate about the hinge to a second position in which the grounding contact of the cover plate is electronically coupled to the ground contact of the motherboard.

22. The method of claim 20 wherein disengaging the cover plate comprises detaching the cover plate from the chassis prior to installing the motherboard into the chassis.

23. The method of claim 20 wherein engaging the cover plate comprises latching the cover plate to a panel of the chassis to secure the cover plate in an engaged position.

24. The method of claim 20 wherein engaging the cover plate comprises fastening the cover plate to a panel once the grounding contact of the cover plate is electronically coupled with the ground contact on the motherboard.

25. A method of assembling a computer, comprising:

providing a computer chassis having housing including a plurality of sections forming an interior area to contain components of the computer and an input/output aperture in one of the sections, and a moveable cover plate having a fastening portion releasably attachable to the housing to cover the input/output aperture, the cover plate having a first surface, a second surface opposite the first surface, and a grounding contact on the first surface, the cover plate being positionable with respect to the housing between an engaged position in which the first surface faces the interior area of the housing and the grounding contact is positioned to be electrically coupled with a ground contact of the motherboard, and a disengaged position in which the grounding contact is positioned to be separated from the ground contact of the motherboard;

installing the motherboard into the housing; and closing the cover plate over the aperture to engage the grounding contact on the cover plate with the ground contact of the motherboard.

26. The method of claim 25 wherein closing the cover plate comprises rotating the cover plate about a hinge attached to the cover plate and the housing from the disengaged position in which the grounding contact of the cover plate is moved away and disengaged from the ground contact of the motherboard to the engaged position in which the grounding contact of the cover plate is electronically coupled to the ground contact of the motherboard.

27. The method of claim 25, further including detaching the cover plate from the housing.

28. The method of claim 25 wherein closing the cover plate further comprises latching the cover plate to a panel of the housing to secure the cover plate in the engaged position.

29. The method of claim 25 wherein closing the cover plate further comprises fastening the cover plate to the housing once the grounding contact of the cover plate is engaged with a ground contact on the motherboard.

* * * * *